(12) United States Patent
Jiang

(10) Patent No.: US 11,869,743 B2
(45) Date of Patent: Jan. 9, 2024

(54) HIGH THROUGHPUT MULTI-ELECTRON BEAM SYSTEM

(71) Applicant: KLA Corporation, Milpitas, CA (US)

(72) Inventor: Xinrong Jiang, Palo Alto, CA (US)

(73) Assignee: KLA CORPORATION, Milpitas, CA (US)

( * ) Notice: Subject to any disclaimer, the term of this patent is extended or adjusted under 35 U.S.C. 154(b) by 200 days.

(21) Appl. No.: 17/317,861

(22) Filed: May 11, 2021

(65) Prior Publication Data

US 2022/0367140 A1 Nov. 17, 2022

(51) Int. Cl.
| | |
|---|---|
| *H01J 37/09* | (2006.01) |
| *H01J 37/12* | (2006.01) |
| *H01J 37/073* | (2006.01) |
| *H01J 37/14* | (2006.01) |

(52) U.S. Cl.
CPC ............ *H01J 37/09* (2013.01); *H01J 37/073* (2013.01); *H01J 37/12* (2013.01); *H01J 37/14* (2013.01); *H01J 2237/0453* (2013.01); *H01J 2237/0473* (2013.01)

(58) Field of Classification Search
CPC .......... H01J 37/09; H01J 37/073; H01J 37/12; H01J 37/14
See application file for complete search history.

(56) References Cited

U.S. PATENT DOCUMENTS

| | | | |
|---|---|---|---|
| 8,362,425 B2 | 1/2013 | Han et al. | |
| 10,748,739 B2 | 8/2020 | Jiang et al. | |
| 2005/0062480 A1* | 3/2005 | Pearl | H01J 37/08 324/464 |
| 2014/0291510 A1* | 10/2014 | Chen | H01J 37/292 250/307 |
| 2015/0155133 A1* | 6/2015 | Chen | H01J 37/285 250/310 |
| 2019/0378705 A1 | 12/2019 | Jiang et al. | |
| 2020/0258714 A1* | 8/2020 | Cook | H01J 37/28 |
| 2020/0373115 A1 | 11/2020 | Mohammadi-Gheidari et al. | |

FOREIGN PATENT DOCUMENTS

| | | | |
|---|---|---|---|
| WO | WO-9610836 A1 * | 4/1996 | H01J 3/021 |
| WO | 2020239507 A1 | 12/2020 | |

OTHER PUBLICATIONS

Jansen, "Coulomb Interactions in Particle Beams", 1990, p. 519, Academic Press, Inc.
WIPO, ISR for International Application No. PCT/US2022/026852, Aug. 18, 2022.

\* cited by examiner

*Primary Examiner* — David P Porta
*Assistant Examiner* — Casey Bryant
(74) *Attorney, Agent, or Firm* — Hodgson Russ LLP

(57) ABSTRACT

Multiple electron beamlets are split from a single electron beam. The electron beam passes through an acceleration tube, a beam-limiting aperture, an anode disposed between an electron beam source and the acceleration tube, a focusing lens downstream from the beam-limiting aperture, and a micro aperture array downstream from the acceleration tube. The micro aperture array generates beamlets from the electron beam. The electron beam can be focused from a divergent illumination beam into a telecentric illumination beam.

20 Claims, 11 Drawing Sheets

HIGH THROUGHPUT MULTI-ELECTRON BEAM SYSTEM

FIELD OF THE DISCLOSURE

This disclosure relates to electron beam systems.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. As design rules shrink, the population of potentially yield-relevant defects detected by inspection grows dramatically, and the population of nuisance defects detected by inspection also increases dramatically. Therefore, more defects may be detected on the wafers, and correcting the processes to eliminate all of the defects may be difficult and expensive. Determining which of the defects actually have an effect on the electrical parameters of the devices and the yield may allow process control methods to be focused on those defects while largely ignoring others. Furthermore, at smaller design rules, process-induced failures, in some cases, tend to be systematic. That is, process-induced failures tend to fail at predetermined design patterns often repeated many times within the design. Elimination of spatially-systematic, electrically-relevant defects can have an impact on yield.

A focused electron beam system is commonly used to create or examine the microstructure of articles, such as a silicon wafer used in the fabrication of integrated circuits. The electron beam is formed with electrons that are emitted from an emitter in an electron gun, which acts as a fine probe when it interacts with the wafer for examining microstructures.

The electron source, such as a thermal field emission (TFE) or cold field emission (CFE) source, emits electrons from an emitter tip. The electrons are focused by a gun lens (GL) into a large size electron beam. The high current electron beam is collimated by the gun lens into a telecentric beam to illuminate a micro aperture array (μAA). The beam-limiting aperture (BLA) following the gun lens is used to select the total beam current in illuminating the aperture array. The micro aperture array is used to select the beam current for each single beamlet. Downstream of the micro aperture array, a micro lens array (MLA) focuses each beamlet onto an intermediate image plane (IIP). A micro lens (μL) may be a magnetic lens or electrostatic lens. A magnetic micro lens may be a number of magnetic pole pieces powered by coil excitations or permanent magnets. An electrostatic micro lens may be an electrostatic Einzel lens, or an electrostatic accelerating/decelerating unipotential lens.

The optics in FIG. 1 may be divided into the upper column optics above the intermediate image plane and lower column optics below the intermediate image plane. The lower column optics may include a transfer lens (TL), an objective lens (OL), and a beam crossover (xo) between the transfer lens and objective lens. The lower column optics is a projection optics. The beamlets formed by the upper column at the intermediate image plane are projected by the transfer lens and objective lens on the wafer (WF) with an optimal magnification at which all the beam blurs for each beamlet at wafer are minimized. For inspecting and reviewing a wafer, the secondary electrons (SE) and/or back-scattered electrons (BSE) emitted from the wafer due to the bombardments of each primary beamlet may be split from the optical axis and deflected towards a detection system (Det) by a Wien filter.

The throughput of a multi-electron beam apparatus for wafer inspection and review can be limited by the number of the beamlets in FIG. 1. The throughput can be increased if the number of beamlets increases. However, increasing the number of the beamlets is limited by the optics in the upper column in FIG. 1.

FIG. 2 shows the construction of the first embodiment of the upper column in FIG. 1. The gun lens is a combined electrostatic lens and magnetic lens. The electrostatic lens is an acceleration lens, which includes an electron source and an anode. The electron source includes an electron emission tip, a suppressor (Sup), and an extractor (Ext). The anode is combined with an acceleration tube, on which an acceleration voltage ($V_a$) may be applied. A beam-limiting aperture is deployed inside the acceleration tube. The anode, beam-limiting aperture, and acceleration tube are on the same potential of $V_a$. If the $V_a$ is applied as zero, the anode, beam-limiting aperture, and acceleration tube are all equivalent to being grounded. The tip is biased at negative potential with respective to ground, and the extractor is biased less negative than the tip for generating an extracting electrical field in a thermal field emission source. After the acceleration from the extractor to anode, the electron beam energy is $(|V_{tip}|+V_a)$. A magnetic lens is used to focus the electron beam into a telecentric beam to illuminate onto the micro aperture array. The magnetic lens has pole pieces and coils. The pole pieces and coils are sealed in air with a sealing tube for protecting the vacuum for the electrostatic elements from contamination.

FIG. 3 shows the micro aperture array in the construction of the embodiment of FIG. 2. FIG. 4 shows one of the conductive plates in an electrostatic micro lens array. In FIG. 3, the illuminating beam has a diameter of the beam-limiting aperture. The micro aperture array has a size of 2a for each aperture. The aperture holes (2a) are hex-distributed with a pitch of p. In FIG. 4, the micro lens array plate has a thickness of h, which may be in the tens of microns. The micro lens array includes multiple micro lenses (μL). Each micro lens hole has a size of 2 R and is arranged with a pitch of P aligned to the micro aperture in the micro aperture array. The micro lens array plates are aligned to the micro aperture array with the same hole number and distribution. For approaching as rotationally symmetric as possible, a hex-distribution of the holes in the aperture and conductive plates are configured as shown in FIG. 3 and FIG. 4. Each aperture hole size is 2a, and each plate hole size is 2 R. The a and R are in tens of microns, and the R should be greater than a. The spacing (or the pitch) between the neighbor holes (P) may be in a range of tens to hundreds of microns.

The beam-limiting aperture in FIG. 2 is large enough (e.g., hundreds of microns to several millimeters) to select a large beam to cover all the aperture holes of FIG. 3 in the telecentric illumination shown in FIG. 2.

Each micro lens in an electrostatic micro lens array in FIG. 2 and FIG. 4 may be an Einzel lens or an acceleration (deceleration) unipotential lens. Three pieces of the conductive plates in FIG. 4 constitute an Einzel micro lens array. The middle conductive plate is used to adjust the focus of the beamlets on the intermediate image plane, and the first and third conductive plates are grounded. Two pieces of the conductive plates in FIG. 4 may constitute an acceleration (deceleration) unipotential lens. The piece of the plate near the aperture may be grounded, and the other piece of the plate may be applied with a positive voltage to form an acceleration lens or with a negative voltage to form a deceleration lens. The gap between the conductive plates may be in tens of microns.

With computer simulations, the optical limitation of the construction of the embodiment in FIG. 2 has been analyzed to increase throughputs with more electron beamlets in a single multi-electron beam apparatus. FIG. 5 shows the multi-electron beam throughput versus beamlet position distributions. The throughput of a multi-electron beam apparatus may be evaluated with the total number of beamlets, $MB_{tot}$, given by the following equation.

$$MB_{tot} = \frac{1}{4}(1+3M_x^2)$$

In which the $M_x$ is the number of all beamlets in the x-axis in FIG. 5. For instance, within the 5 rings in FIG. 5, the number of all beamlets in x-axis is $M_x=11$, giving the number of total beamlets $MB_{tot}=91$. Within the 10 rings, the $M_x=21$ and $MB_{tot}=331$. Accordingly, the throughput increases with the number of the beamlets in x-axis.

Given a total number of beamlets (e.g., $MB_{tot}=331$) and a pitch of P (e.g., P=100 μm) between the beamlets, the beam-limiting aperture size for a telecentric illumination beam in FIG. 2 can be determined. It is greater than 2 millimeters with certain margins for the illuminating beam to cover all aperture holes. A large beam-limiting aperture with a large emission angle α in FIG. 2 will cause optical issues. The electron emission uniformity across the large emission angle is the first issue. The spherical aberration of the gun lens will be another issue because it is directly proportional to the third power of the large emission angle α.

Computation models and software with Monte Carlo simulations were developed for looking into how severe the gun spherical aberrations influence the resolutions of the beamlets in the construction of the embodiment in FIG. 2. To highlight the gun influence on the resolutions with the telecentric illumination, each micro lens in the micro lens array is assumed to be ideal without aberrations. FIG. 6 shows the results of the computer simulations, giving the spot size of the beamlets at intermediate image plane versus the position of the beamlets in x-axis. A total of 331 beamlets with a pitch of 100 microns are included in the simulations.

The simulation results in FIG. 6 suggest that the beamlet resolutions will degrade sharply with increasing the number of total beamlets ($MB_{tot}$). Thus, beamlet resolution will degrade with higher throughputs. From the homogenous requirement of the beamlet resolutions across the (x,y) space, FIG. 6 may suggest using the beamlets within the third ring in FIG. 5, or a total 37 beamlets only (i.e., $M_x=7$, and $MB_{tot}=37$). At most if using the total 91 beamlets within the fifth ring in FIG. 5 (i.e., $M_x=11$, and $MB_{tot}=91$), the resolutions of the beamlets in outer ring will degrade more than 20%, which is unacceptable for electron beam wafer inspections and reviews.

A single electron beam has been used for wafer inspection and review, and is an approach for examining finished or unfinished integrated circuit components in nanometer critical dimension (CD) levels. Because the throughput of a single electron beam apparatus is fairly low, multi-electron beam systems were developed to raise throughputs. The throughput of a multi-electron beam system can be based on the number of sub-beams, or the number of total electron beamlets. The larger the beamlet number, the higher the throughput will be. However, increasing the number of beamlets in radial directions can be limited by the electron optical column where the multi-electron beamlets are split from one electron source. Increasing the beamlet number means increasing the emission angle of an electron source, which causes an increase of spherical aberration of the gun lens and degradation of the outer-ring beamlet resolutions because the gun lens spherical aberration is proportional to the third power of the emission angle. Therefore, improved electron beam systems are needed.

BRIEF SUMMARY OF THE DISCLOSURE

A system is provided in a first embodiment. The system includes an electron beam source that generates an electron beam. The electron beam source includes a tip, a suppression electrode, and an extraction electrode. An acceleration tube is disposed in a path of the electron beam. A beam-limiting aperture is disposed in the acceleration tube. An anode is disposed in the path of the electron beam between the electron beam source and the acceleration tube. A focusing lens is disposed in the path of the electron beam downstream from the beam-limiting aperture. A micro aperture array is disposed in the path of the electron beam downstream from the acceleration tube. The micro aperture array is configured to generate a plurality of beamlets from the electron beam.

The focusing lens can be an electrostatic focusing lens. In an instance, the focusing lens is disposed in the path of the electron beam on an opposite side of the acceleration tube from the anode and the micro aperture array is disposed in the path of the electron beam on an opposite side of the focusing lens from the acceleration tube.

The focusing lens can be a magnetic focusing lens. In an instance, the focusing lens is disposed around the acceleration tube and is disposed on an opposite side of the acceleration tube from the anode. The micro aperture array can be disposed on the acceleration tube. The acceleration tube can be grounded.

The tip can be a thermal field emitter.

The system can further include a micro lens array that receives the beamlets from the micro aperture array.

The system can further include a transfer lens and an objective lens in the path of the beamlets downstream of the micro aperture array.

The micro aperture array can include more than 100 micro apertures.

A method is provided in a second embodiment. The method includes directing an electron beam from an electron beam source to an acceleration tube. The electron beam is directed through a beam-limiting aperture in the acceleration tube. The electron beam is focused after the electron beam enters the acceleration tube. The electron beam is directed through a micro aperture array disposed in the path of the electron beam downstream from the acceleration tube thereby forming a plurality of beamlets from the electron beam.

The acceleration tube can be grounded, can have an acceleration voltage of greater than 0 V, or can have an acceleration voltage of less than 0 V.

The beam current between the beam-limiting aperture and the micro aperture array can be at least 10 µA.

The electron beam can be focused from a divergent illumination beam into a telecentric illumination beam.

More than 100 of the beamlets can be generated using the micro aperture array.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

In the embodiments disclosed herein, a divergent illumination beam with a smaller emission angle is focused into a telecentric illumination beam by a collimated lens. This not only reduces the gun lens spherical aberration, but also removes the off-axis blurs and distortion in a micro lens array and can raise the throughput by 5× or more. The spherical aberration from the gun lens can be responsible for degradation of the beamlet resolution when increasing the throughput (or with increasing the number of total beamlets) because each micro lens in the micro lens array is assumed ideal without any aberration. The spherical aberration from the gun lens is proportional to the third power of the beam-limiting aperture size (or the emission angle $\alpha$).

To reduce the spherical aberration from the gun lens the emission angle $\alpha$ is reduced using a high brightness (or angular intensity) electron source. For instance, if the emission angle $\alpha$ is reduced 2× while increasing the angular intensity 4× at the same beam currents, the spherical aberration will be reduced 8×. In this instance, the emission angle can be from approximately 150 mrad to 200 mrad and the angular intensity can be from approximately 0.8 mA/sr to 1.2 mA/sr. An 8× reduction of the spherical aberration in FIG. 6 would be sufficient for a total 331 beamlets (i.e., $M_x=21$, and $MB_{tot}=331$), increasing the throughput from 3.6× to 9× (e.g., 5× or more), though a number of beamlets from 300 to 500 may be used.

Figure 2:
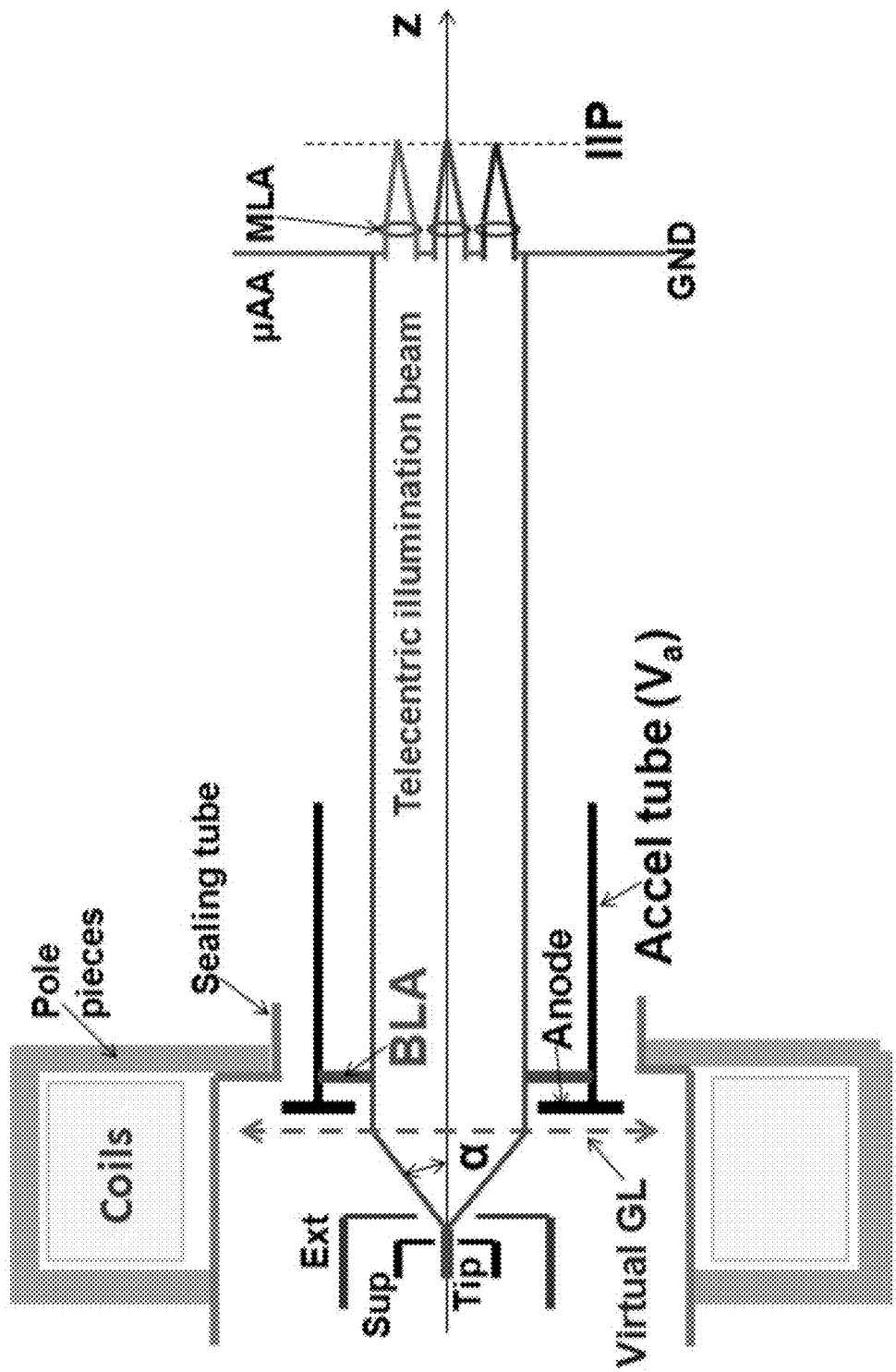
FIG. 2 is an embodiment of an upper column in the multi-electron beam system of FIG. 1.
Figure 3:
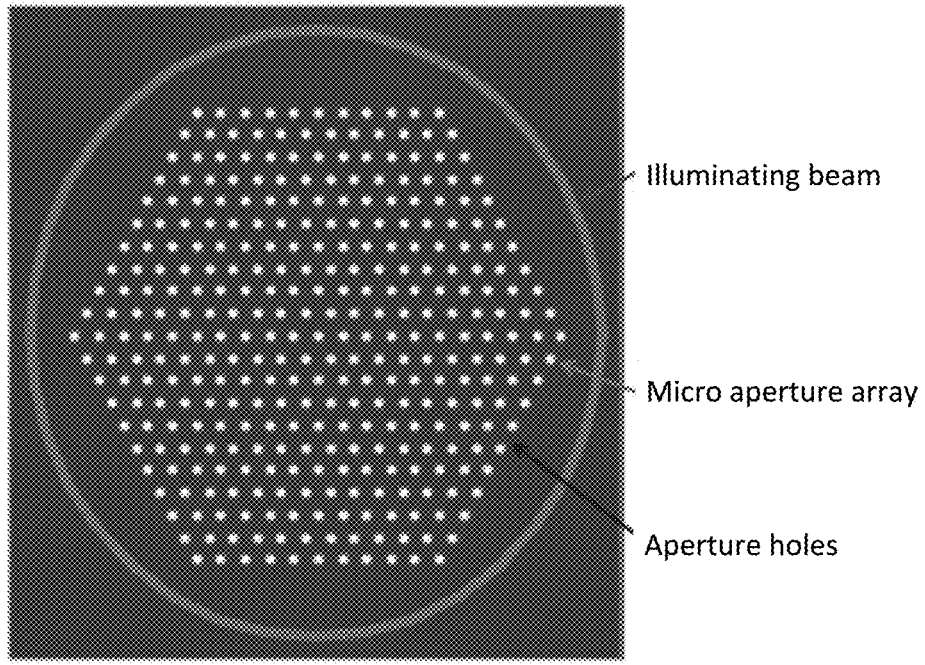
FIG. 3 is an embodiment of a micro aperture array of FIG. 2.
Figure 4:
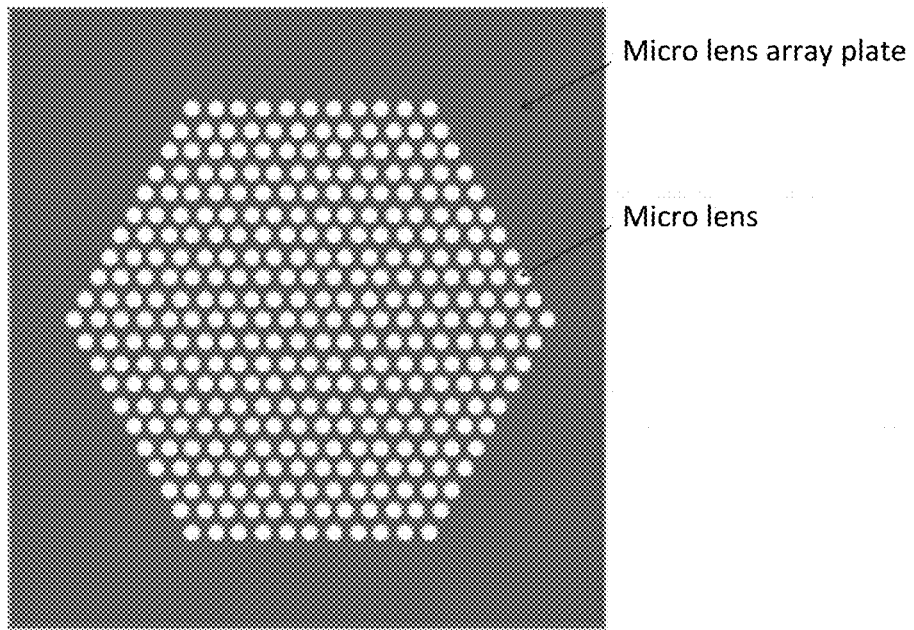
FIG. 4 is a conductive plate used as an electrostatic micro lens array.
Figure 5:
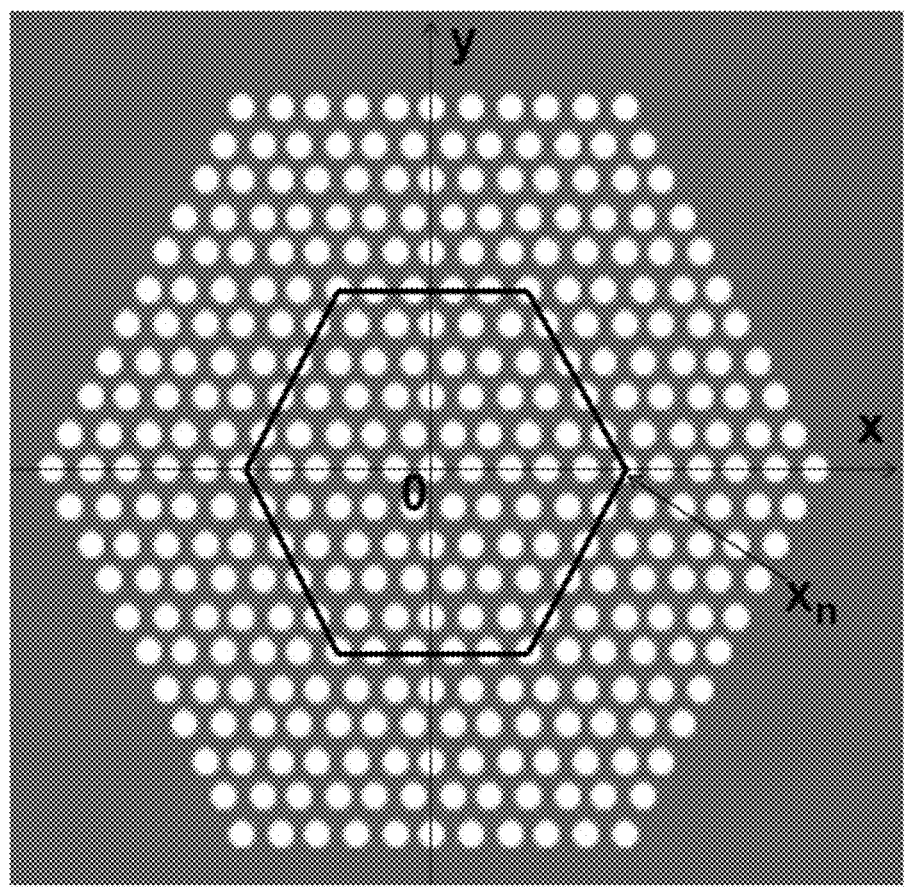
FIG. 5 shows multi-electron beam throughput versus beamlet position distributions.
Figure 7:
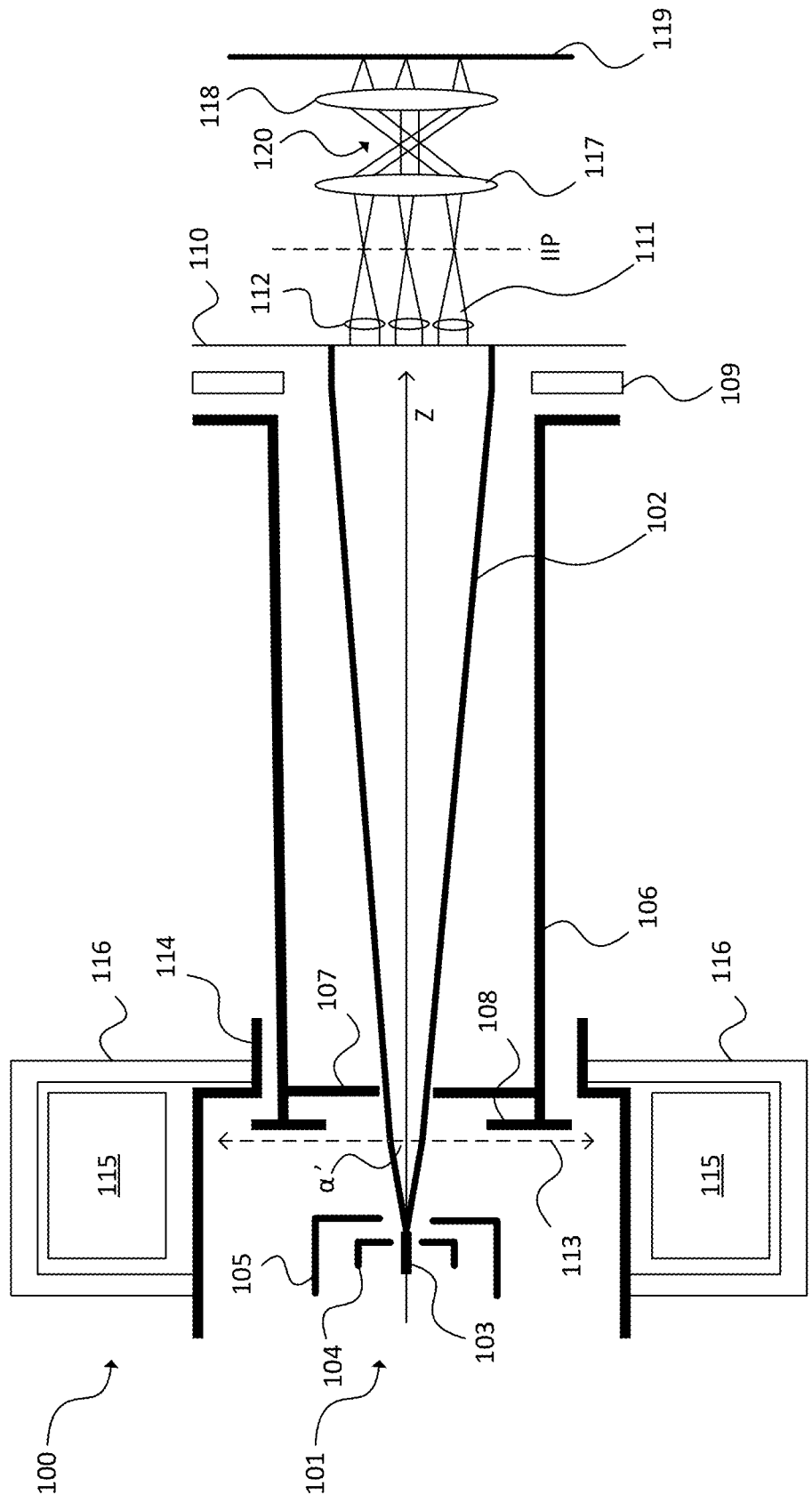
FIG. 7 is a first embodiment of an electron beam system in accordance with the present disclosure.
Figure 8:
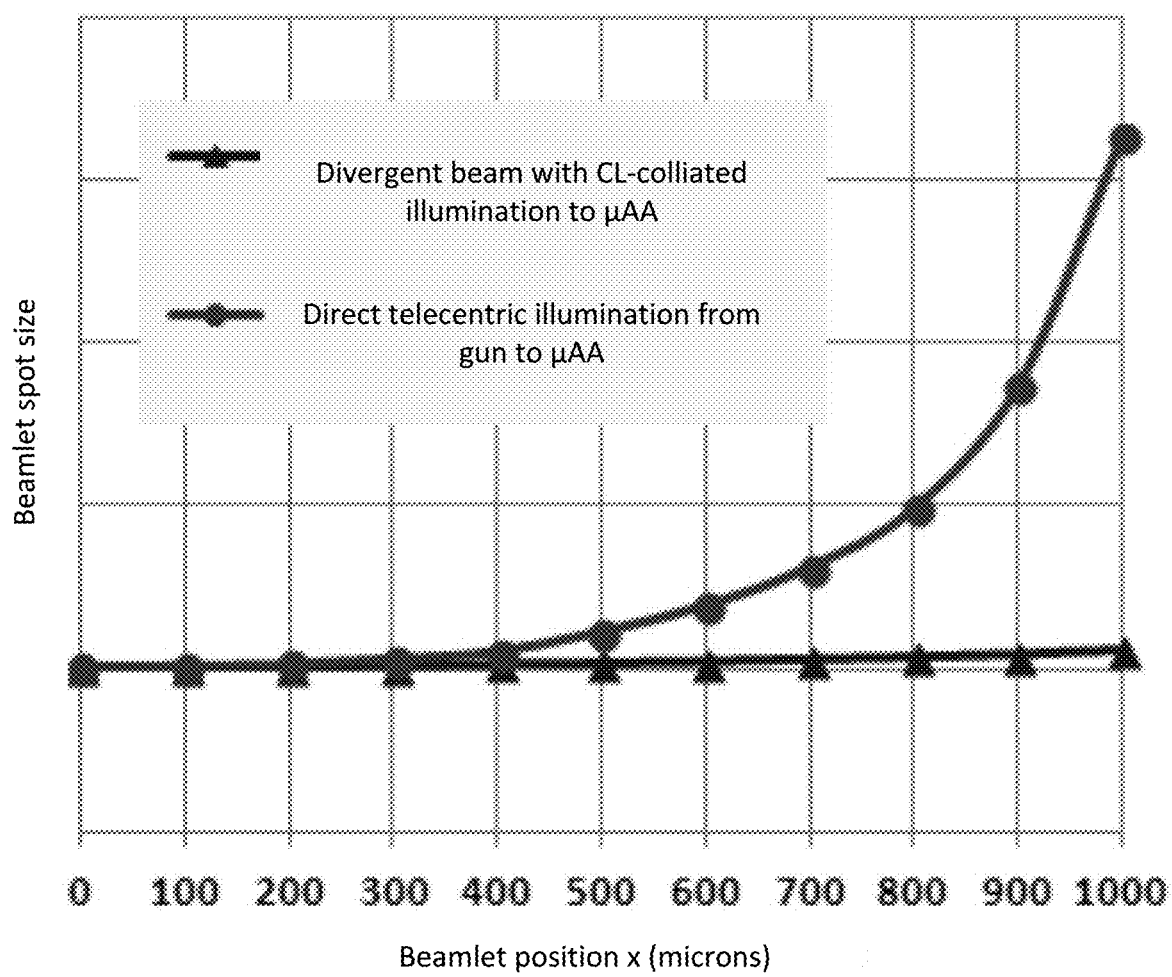
FIG. 8 shows a comparison of beamlet resolution versus beamlet position demonstrating improved results for the embodiment of FIG. 7.

FIG. 8 demonstrates that the resolution at the fourth ring with the directly telecentric illumination method with total 61 beamlets ($M_x=9$, and $MB_{tot}=61$) in FIG. 2 approaches the resolution at tenth ring with the collimated illumination method with total 331 beamlets ($M_x=21$, and $MB_{tot}=331$) in FIG. 7. This means that the throughput in the latter is 5× raised than the throughput in the former. The throughput in FIG. 2 may be unacceptable for recent applications in semiconductor manufacturing.

In the electron beam system 100 of FIG. 7, an electron beam source 101 generates an electron beam 102. The electron beam 102 is a collimated telecentric beam. The electron beam source 101 can include a tip 103, a suppression electrode 104, and an extraction electrode 105. The tip 103 can be a thermal field emitter or another type of electron beam source.

The tip size (radius) of the electron beam source 101 may be approximately 1 µm for high angular intensity (e.g., 1 mA/sr). The tip may be biased around −30 kV for an effective beam energy of 30 keV. The acceleration tube 106 may be grounded for the 30 keV illuminating beam or may be from approximately 10 kV to 30 kV positively-biased for an accelerating illuminating beam to reduce Coulomb interactions. The extractor bore size may be from approximately 500 µm to 1000 µm. The distance between the extractor and acceleration tube 106 may be larger than 10 mm.

An acceleration tube 106 is disposed in a path of the electron beam 102. The acceleration tube 106 is downstream of the electron beam source 101. A beam-limiting aperture 107 can be positioned in the acceleration tube 106. For example, the beam-limiting aperture 107 can be positioned in the acceleration tube 106 near the opening of the acceleration tube 106 proximate the electron beam source 101. A virtual gun lens 113 is illustrated.

Proximate the electron beam source 101 and acceleration tube 106 is a sealing tube 114. Coils 115 and pole pieces 116 are located outside of or around the sealing tube 114.

The distance between the beam-limiting aperture 107 and the micro aperture array 110 (or the acceleration tube 106 length) may be, for example, from approximately 100 mm to 150 mm to reduce the source emission angle (the gun lens spherical aberration). If this distance is too short, the emission angle may still be large even if the collimated lens is used. Mechanical components (e.g., valves and pumping system) can be configured to provide a reasonable distance from the beam-limiting aperture 107 and the micro aperture array 110.

With the help of the collimated lens, the beam-limiting aperture 107 size can be reduced to approximately 750 μm to 1000 μm for illuminating beam currents from approximately 10 μA to 25 μA controlled by the gun magnetic lens excitations.

If the acceleration tube is always grounded, the beam-limiting aperture 107 may be separately positioned in the front of the acceleration tube 106 and grounded. However, if the acceleration tube 106 is used for acceleration, the beam-limiting aperture 107 and the acceleration tube 106 will form an electrostatic lens. In an embodiment, the beam-limiting aperture 107 and the top of the acceleration tube 106 in FIG. 7 can be in a floating anode.

An anode 108 can be disposed in the path of the electron beam 102 between the electron beam source 101 and the acceleration tube 106. The anode 108 can be disposed on the acceleration tube 106. For example, the anode 108 can be disposed on or at the opening of the acceleration tube 106 proximate the electron beam source 101.

Figure 11:
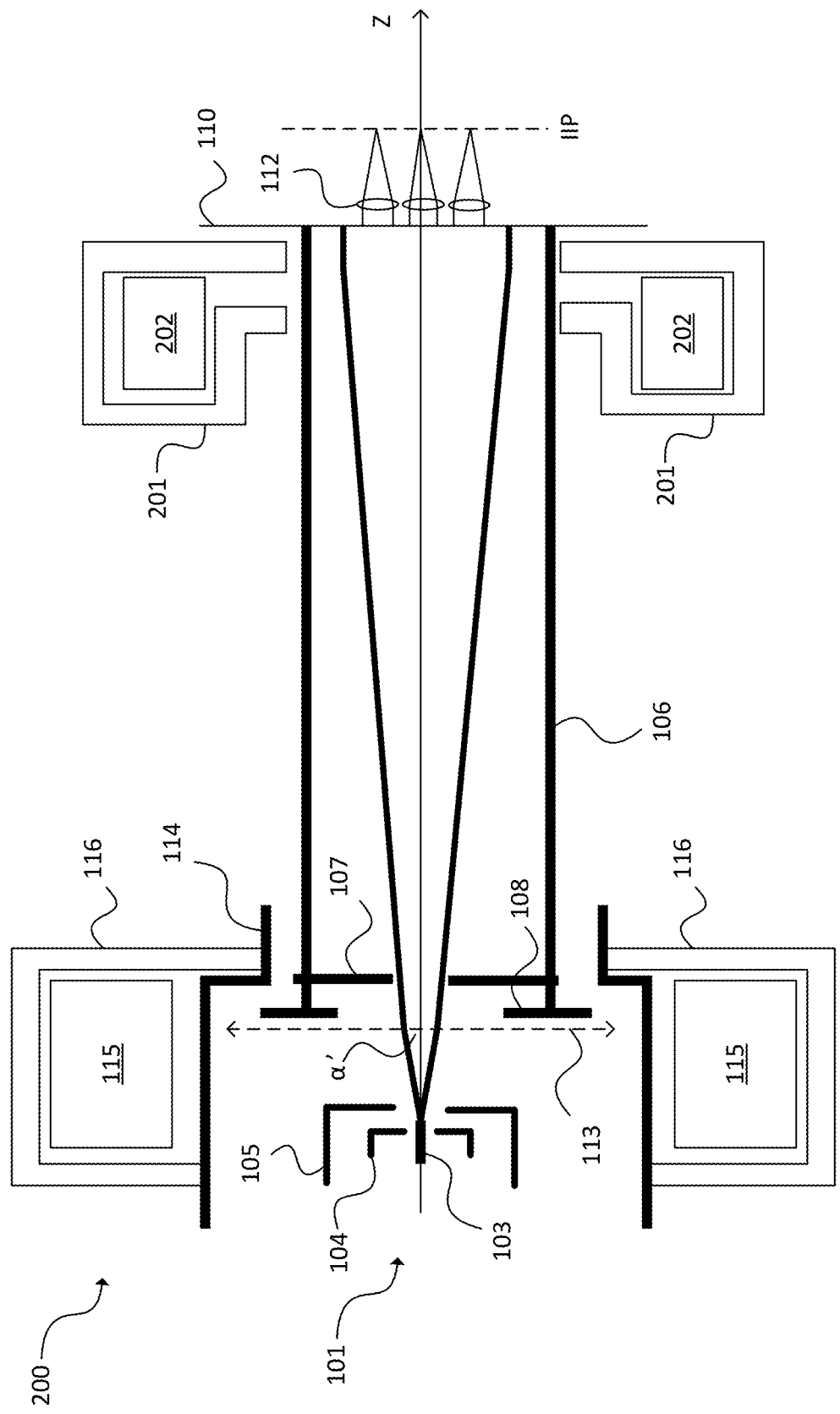
FIG. 11 is a second embodiment of an electron beam system in accordance with the present disclosure.

A focusing lens 109 is disposed in a path of the electron beam 102 downstream from the beam-limiting aperture 107. The focusing lens 109 can be an electrostatic focusing lens or a magnetic focusing lens. If the focusing lens 109 is a magnetic focusing lens, then the focusing lens 109 can be disposed around the acceleration tube 106 on an opposite side of the acceleration tube 106 from the anode 108, such as shown in FIG. 11. In the example of FIG. 11, the micro aperture array 110 can be disposed on the acceleration tube 106 and the acceleration tube 106 can be grounded.

Turning back to FIG. 7, the focusing lens 109 can be on an opposite side of the acceleration tube 106 from the anode 108 if it is an electrostatic focusing lens. Thus, the anode 108 can be positioned on or at the opening of the acceleration tube 106 proximate the electron beam source 101 and the focusing lens 109 can be positioned proximate the opposite opening of the acceleration tube 106.

A micro aperture array 110 is disposed in the path of the electron beam 102 downstream from the acceleration tube 106. The micro aperture array 110 is configured to generate beamlets 111 from the electron beam 102. There may be one micro aperture for each beamlet. For example, the micro aperture array 110 can include more than 100 micro apertures, which generates more than 100 of the beamlets 111. In an instance with approximately 100 μm spacing between beamlets 111, from 100-500 beams can be generated with an approximately 30 μm micro aperture and an approximately 50 μm micro lens bore. The micro aperture array 110 can be disposed in a path of the electron beam 102 on an opposite side of the focusing lens 109 from the acceleration tube 106. The micro aperture array 110 can be positioned a non-zero distance from the acceleration tube 106.

A micro lens array 112 is positioned to receive beamlets 111 from the micro aperture array 110. The images (i.e., the beamlet spot sizes) of the micro lens array 112 can become the objects of the downstream projection optics. Multi-electron probes can be formed at a wafer downstream of the micro lens array 112.

The multi-electron probe currents reaching the wafer are the single beam currents selected by the collimated lens and micro aperture array 110. The single beam currents are split from the illuminating raw beam current that is selected by the magnetic gun lens excitation and beam-limiting aperture 107.

Figure 1:
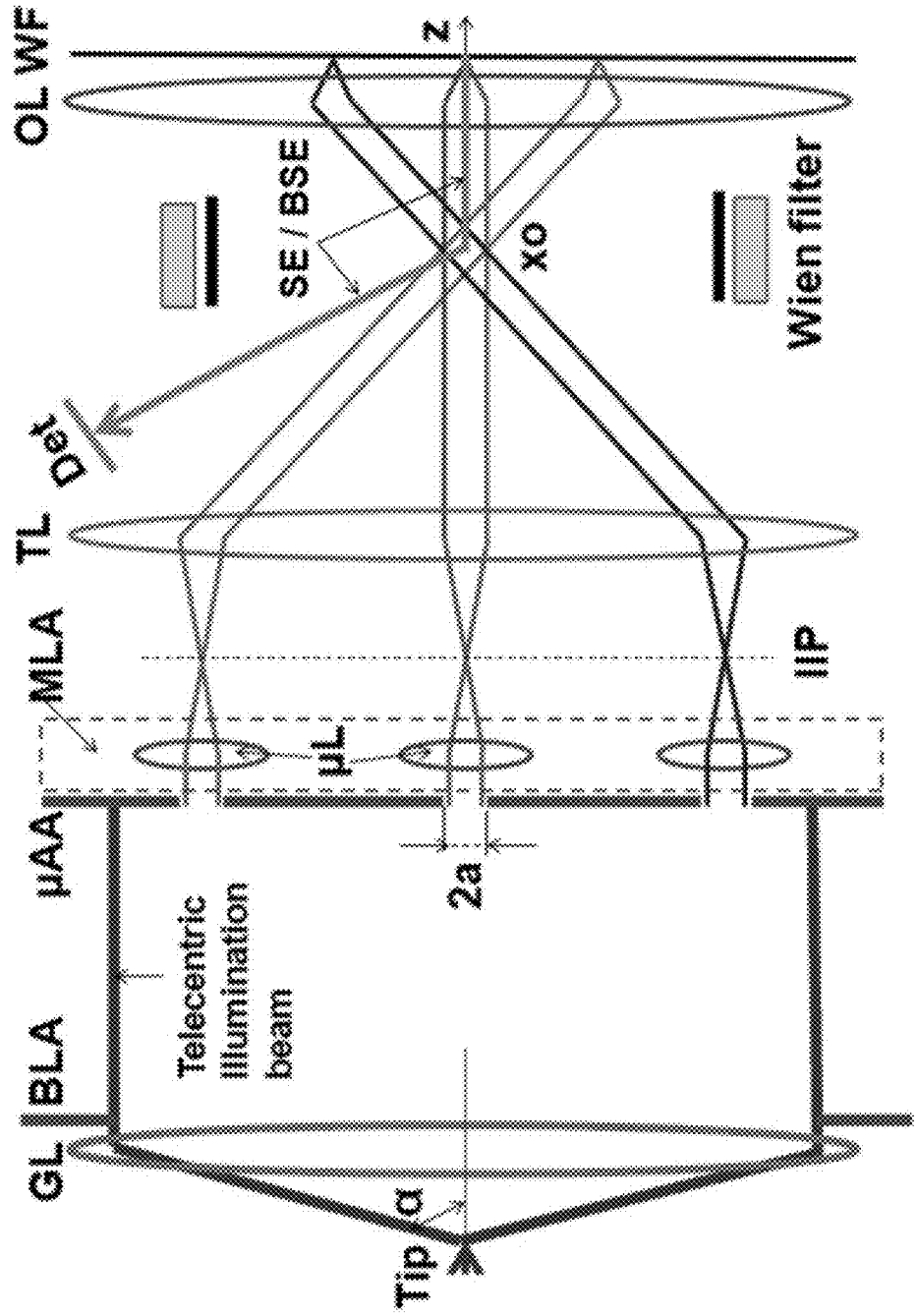
FIG. 1 shows a previous design of a multi-electron beam system.

A transfer lens 117, an objective lens 118, and a wafer 119 can be positioned in the path of the beamlets 111 downstream of the micro aperture array 110. There can be a crossover 120 between the transfer lens 117 and objective lens 118. Separate images can be formed using beam scans and/or each beamlet 111, such as using a detector similar to that in FIG. 1.

In FIG. 7, the small emission angle α' can eliminate the gun lens spherical aberration. A collimated lens (CL) is deployed in the front of the micro aperture array 110 to focus the divergent electron beam 102 from the gun. The collimated lens can be an electrostatic lens, which includes the acceleration tube 106 with a voltage Va, the focusing electrode 109 applied with a collimating voltage VC, and the electrode of the micro aperture array 110 that is grounded. The collimated lens may be an asymmetrical Einzel lens. With an optimal collimating voltage VC, the divergent electron beam 102 is collimated in a telecentric beam to illuminate the micro aperture array 110 and micro lens array 112. Off-axis aberrations and distortion are removed.

Figure 6:
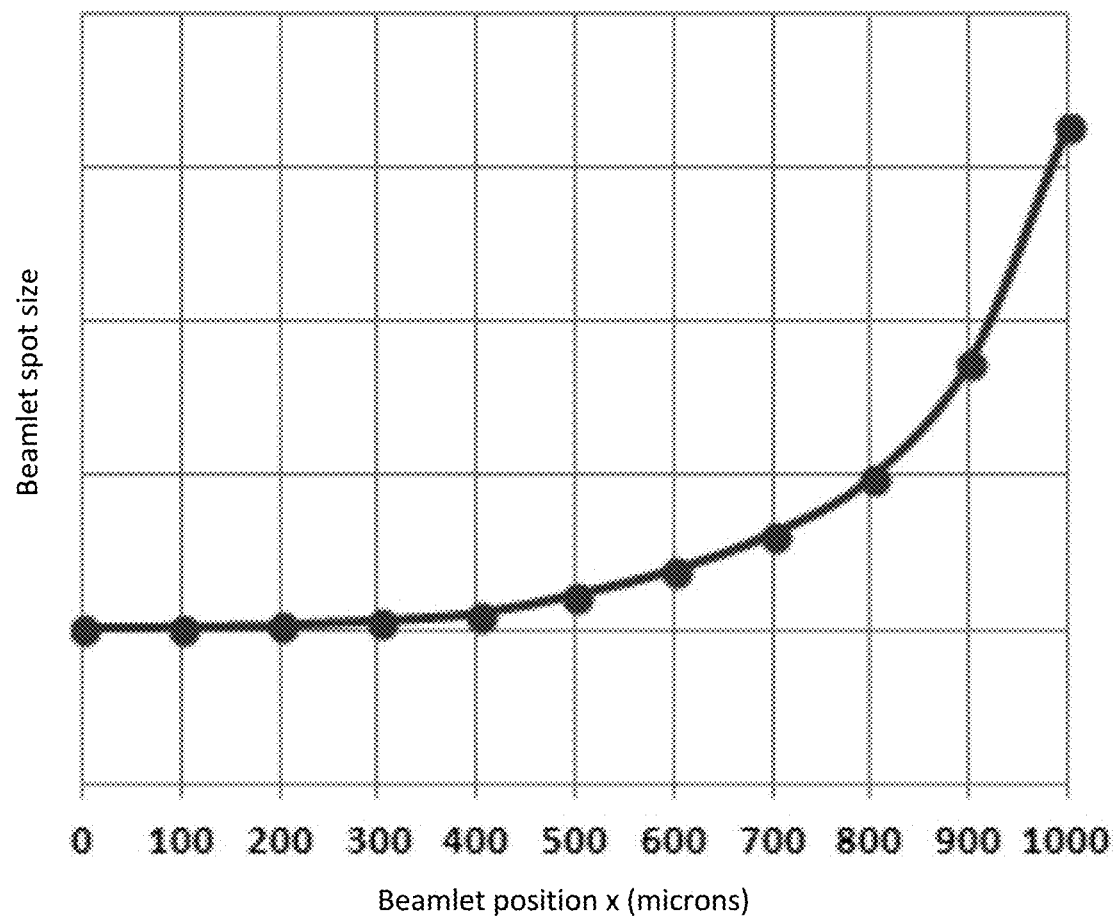
FIG. 6 shows simulated results of beamlet spot size versus beamlet position in the x-axis in a telecentric illumination of the embodiment of FIG. 2.

The computer simulations used to study the design of FIG. 2 and generate the results of FIG. 6 were used to evaluate the resolution and throughput for the electron beam system 100 of FIG. 7. FIG. 8 shows the comparison of the optical performance using the direct-telecentric illumination in FIG. 2 and the divergent-collimated illumination in FIG. 7. FIG. 8 shows that throughput improvements can be achieved by using a smaller emission angle α' to reduce gun lens spherical aberration and by collimating the divergent beam to telecentrically illuminate the micro aperture array 110 and micro lens array 112 to remove off-axis blurs and distortion. The extent of the effects of the smaller emission angle α' are surprising.

The emission angle α' and beam-limiting aperture 107 size in FIG. 7 can be selected and fixed for sufficient illumination beam current. For a given divergent beam angle, there can be an optimum collimated lens voltage $V_{c-opt}$ on which the divergent beam can be completely collimated into a telecentric illumination beam to eliminate the off-axis blurs and distortion generated in the micro lens array 112, as can be seen in FIG. 9 with the computer simulation of ray-tracing from the electron beam source 101 to micro lens array 112.

In FIG. 7 and FIG. 8, an 800 μm beam-limiting aperture was used for from approximately 10 μA to 25 μA illuminating beam currents. With the angular intensity of 1.0 mA/sr, the emission angle is from approximately 56 mrad to 90 mrad. Off-axis blurs may be completely removed if the illuminating beam is completely telecentric.

Figure 9:
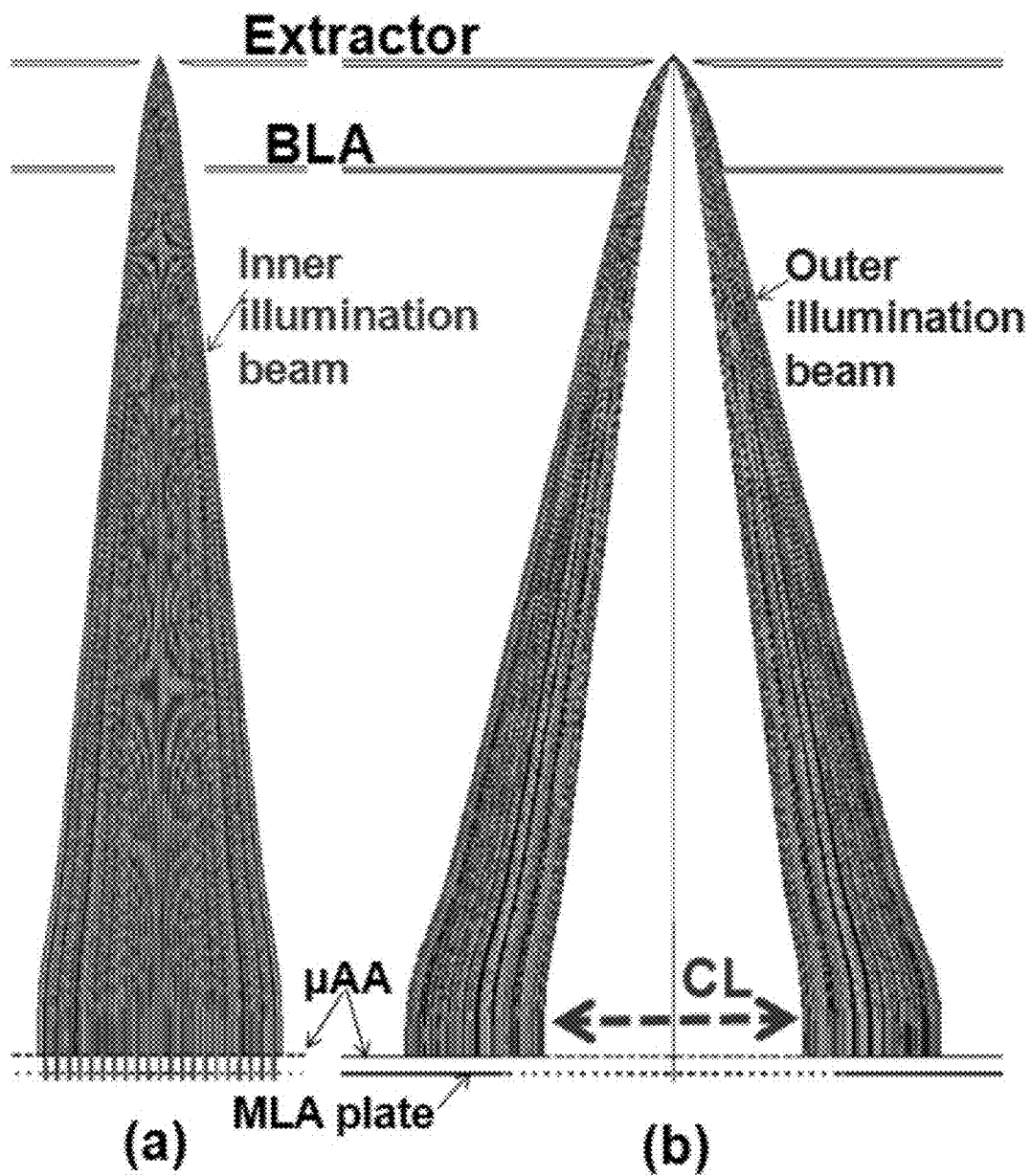
FIG. 9 shows direct ray-tracing of the (a) inner illumination electron beam and (b) outer illumination electron beam.

In FIG. 9, the tip-emitted electron trajectories in a maximum emission angle of α' are divided into two groups of electron rays for description convenience. The group of inner illumination beam is assumed useful and allowed entering the micro aperture array 110 and split into beamlets 111. These beamlets 111 are separately focused by the micro lens array 112 and image-formed at the intermediate image plane. The group of outer illumination beam is assumed to be margin beam, which is stopped by the micro aperture array 110. Both the inner and outer illumination beams are all focused by the collimated lens to telecentrically illuminate the micro aperture array 110.

Figure 10:
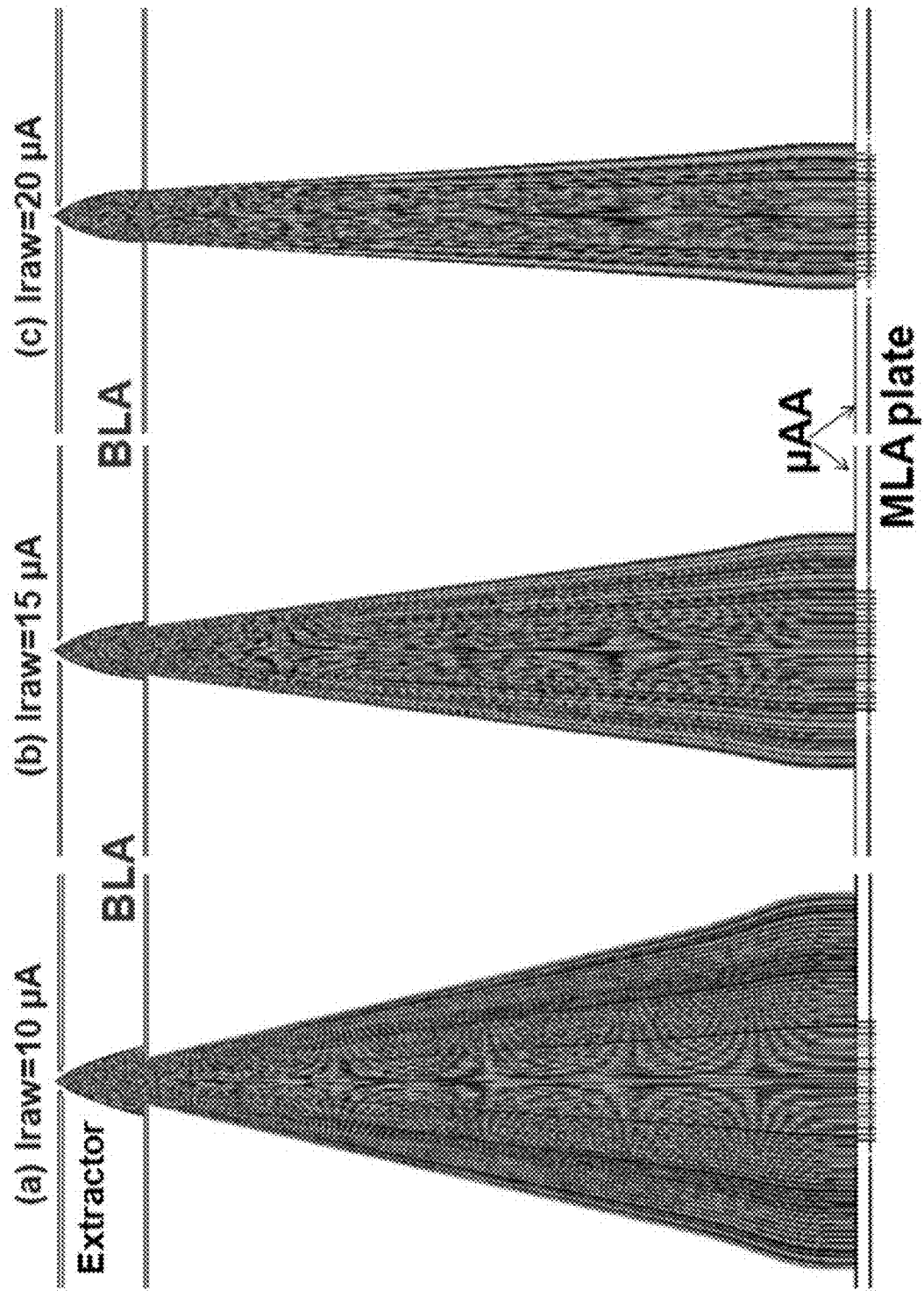
FIG. 10 shows selections of single beam current (SBC) for each electron beamlet.

Compared to the directly telecentric illumination method in FIG. 2, the divergent beam with collimated illumination method in FIG. 7 may select single beam current (SBC) across a large range, which is another advantage of the electron beam system 100. This advantage is exhibited in FIG. 10. In FIG. 10, each beamlet current may be varied for particular applications by changing the magnetic gun lens coil current. Thus, the beamlet current can be affected by changing the beam divergent angle and not the emission angle. For instance, using the magnetic lens excitations A, B and C (C>B>A) reaches the raw beam current (i.e. $I_{raw}$, the beam current below the fixed beam-limiting aperture 107) 10, 15, and 20 micron Amperes in (a), (b), and (c) of FIG. 10, respectively. Then, applying the optimal collimation voltage $V_{Ca}$, $V_{Cb}$, and $V_{Cc}$ ($V_{Cc}<V_{Cb}<V_{Ca}$) to focus the divergent beam selects the single beam currents of 0.25 nA, 1.0 nA, and 5.0 nA in the optical columns of (a), (b) and (c) of FIG. 10, respectively. For example, the total beamlet current may be 5.0×331=1655 (nA) with total 331 beamlets in (c) of FIG. 10, giving 8.3% use rate of the 20 μA raw beam current.

The collimated lens in an embodiment in FIG. 7 may function in three lens focusing modes. One is the Einzel lens mode if grounding the acceleration tube or setting the acceleration voltage $V_a=0$ Volts. The second is the decelerating lens mode if the acceleration tube is set ($V_a<0$) Volts. The third is the accelerating lens mode if the acceleration tube is set ($V_a>$) 0 Volts. A collimated lens voltage, $V_{C-opt}$, can be selected for any a collimated lens focusing mode to best illuminate the micro aperture array 110 and micro lens array 112 telecentrically to remove the off-axis blurs and distortion.

The beam current in between beam-limiting aperture 107 and the micro aperture array 110 may be fairly high (e.g., sub-ten to tens of micro-Amperes), so an acceleration tube 106 with the voltage $V_a>>0$ Volts can be used to reduce the influence of Coulomb interactions between electrons on beamlet resolutions.

The collimated lens can be improved if it is positioned close to the micro aperture array 110. For example, the gap between the collimated lens and micro aperture array 110 in FIG. 7 may be approximately 10 mm. The farther the collimated lens is deployed away from the micro aperture array 110, the larger the emission angle α' may be needed to focus the beam to completely cover the micro aperture array 110 with certain margins. This can lead to higher spherical aberration of the gun lens, which can degrade the beamlet resolution at intermediate image plane. In an instance, a distance between the beam-limiting aperture and the aperture array may be from approximately 100 mm to 150 mm to sufficiently reduce the emission angle α'.

FIG. 11 shows an electron beam system 200, in which a magnetic collimated lens is used to replace the electrostatic collimated lens from FIG. 7. The acceleration tube 106 may be grounded and used as the sealing tube for the magnetic collimated lens. The magnetic collimated lens pole pieces 201 and coils 202 can be sealed in air to protect the vacuum from contamination. A magnetic collimated lens may have lower lens aberrations than an electrostatic collimated lens, which improves beamlet resolutions at the intermediate image plane. The transfer lens 117, an objective lens 118, a wafer 119, and crossover 120 of FIG. 7 can be used in the electron beam system 200 of FIG. 11, but are not illustrated in FIG. 11 to increase simplicity.

Figure 12:
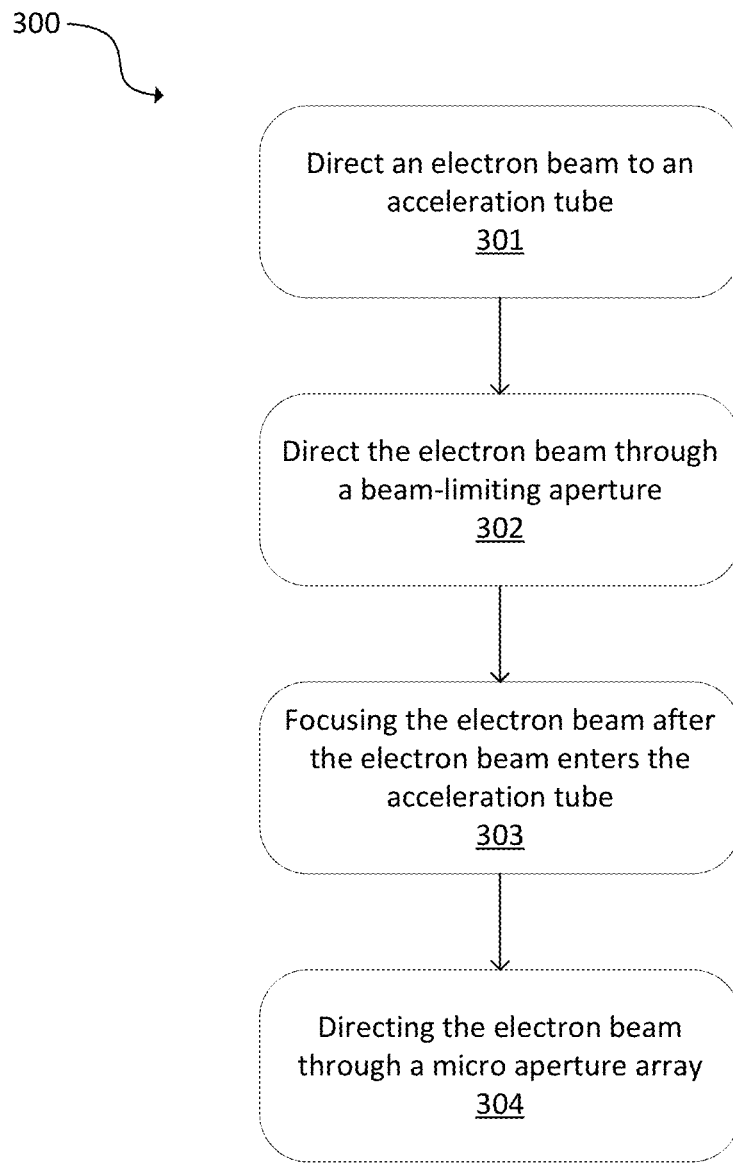
FIG. 12 is a flowchart of a method in accordance with the present disclosure.

FIG. 12 is a flowchart of a method 300. The method 300 can be applied using the electron beam system 100 or electron beam system 200. An electron beam is directed from an electron beam source to an acceleration tube at 301. The acceleration tube can be grounded, can have an acceleration voltage greater than 0 V, or can have an acceleration voltage less than 0 V. The electron beam is directed through a beam-limiting aperture in the acceleration tube at 302. At 303, the electron beam also is focused after entering the acceleration tube. The electron beam can be focused from a divergent illumination beam into a telecentric illumination beam. The beam current between the beam-limiting aperture and the micro aperture array can be at least 10 μA.

The electron beam is directed through a micro aperture array disposed in the path of the electron beam downstream from the acceleration tube at 304. This forms a plurality of beamlets from the electron beam. More than 100 of the beamlets can be generated using the micro aperture array.

These beamlets are split from one electron beam source. Throughput of a multi-electron beam system can be characterized by a number of beamlets. The more beamlets, then generally the larger the throughput.

To avoid the spherical aberrations while increasing the number of beamlets, a collimated lens focuses a divergent illumination beam into a telecentric illumination beam, which can eliminate the influence of the gun lens spherical blurs on beamlet resolution and removes the off-axis blurs and distortion in micro lens array. The illuminating raw beam current and single beam current can be selected across a range. The range can include an illumination raw beam current from approximately 10 μA to 30 μA and single beam current from approximately 0.2 nA to 6 nA for a total of 300-400 beamlets.

A divergent beam from the beam-limiting aperture is focused into a telecentric beam by the collimated lens Theoretically +/−0.5 mrad would be acceptable for the resulting telecentric beam, but the optimal collimated lens voltage can be determined by examining the images at IIP. Influence, blurs, and distortion can be eliminated if the telecentric illumination is perfect.

The collimated lens used in the method 300 can be an electrostatic lens in an Einzel lens mode, an electrostatic lens in an acceleration/deceleration mode, or a magnetic lens sealed in air.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   an electron beam source that generates an electron beam, wherein the electron beam source includes a tip, a suppression electrode, and an extraction electrode;
   an acceleration tube disposed in a path of the electron beam, wherein the acceleration tube has an entrance and an exit opposite the entrance, and wherein the entrance receives the electron beam from the electron beam source;
   a beam-limiting aperture disposed in the acceleration tube, wherein the beam-limiting aperture is near the entrance proximate the electron beam source;
   an anode disposed in the path of the electron beam between the electron beam source and the acceleration tube;

a focusing lens disposed in the path of the electron beam downstream from the beam-limiting aperture; and a micro aperture array disposed in the path of the electron beam downstream from the acceleration tube and the focusing lens, wherein the micro aperture array is configured to generate a plurality of beamlets from the electron beam.

2. The system of claim 1, wherein the focusing lens is an electrostatic focusing lens.

3. The system of claim 2, wherein the focusing lens is disposed in the path of the electron beam on an opposite side of the acceleration tube from the anode.

4. The system of claim 2, wherein the micro aperture array is disposed in the path of the electron beam on an opposite side of the focusing lens from the acceleration tube.

5. The system of claim 1, wherein the focusing lens is a magnetic focusing lens.

6. The system of claim 5, wherein the focusing lens is disposed around the acceleration tube.

7. The system of claim 6, wherein the focusing lens is disposed on an opposite side of the acceleration tube from the anode.

8. The system of claim 6, wherein the micro aperture array is disposed on the acceleration tube.

9. The system of claim 6, wherein the acceleration tube is grounded.

10. The system of claim 1, wherein the tip is a thermal field emitter.

11. The system of claim 1, further comprising a micro lens array that receives the beamlets from the micro aperture array.

12. The system of claim 1, further comprising a transfer lens and an objective lens in the path of the beamlets downstream of the micro aperture array, wherein the transfer lens is configured to provide a crossover in the beamlets between the transfer lens and the objective lens.

13. The system of claim 1, wherein the micro aperture array includes more than 100 micro apertures.

14. A method comprising:

directing an electron beam from an electron beam source to an entrance of an acceleration tube;

directing the electron beam through a beam-limiting aperture in the acceleration tube wherein the beam-limiting aperture is near the entrance proximate the electron beam source;

focusing the electron beam after the electron beam enters the acceleration tube; and directing the electron beam through a micro aperture array disposed in the path of the electron beam downstream from the acceleration tube and the focusing lens thereby forming a plurality of beamlets from the electron beam.

15. The method of claim 14, wherein the acceleration tube is grounded.

16. The method of claim 14, wherein the acceleration tube has an acceleration voltage of greater than 0 V.

17. The method of claim 14, wherein the acceleration tube has an acceleration voltage of less than 0 V.

18. The method of claim 14, wherein the beam current between the beam-limiting aperture and the micro aperture array is at least 10 μA.

19. The method of claim 14, wherein the electron beam is focused from a divergent illumination beam into a telecentric illumination beam.

20. The method of claim 14, wherein more than 100 of the beamlets are generated using the micro aperture array.

* * * * *